(12) United States Patent
Lim et al.

(10) Patent No.: US 11,506,947 B2
(45) Date of Patent: Nov. 22, 2022

(54) DISPLAY DEVICE

(71) Applicant: Samsung Display Co., Ltd., Yongin-si (KR)

(72) Inventors: Heesung Lim, Seoul (KR); Sang-Yoon Bae, Seoul (KR); Jieun Song, Seoul (KR); Beom seok Oh, Suwon-si (KR); Seungkyu Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 177 days.

(21) Appl. No.: 16/985,099

(22) Filed: Aug. 4, 2020

(65) Prior Publication Data
US 2021/0183845 A1 Jun. 17, 2021

(30) Foreign Application Priority Data

Dec. 17, 2019 (KR) .................. 10-2019-0168577

(51) Int. Cl.
G02F 1/1345 (2006.01)
H01L 25/18 (2006.01)
H01L 51/52 (2006.01)
G02F 1/1333 (2006.01)
H01L 27/32 (2006.01)

(52) U.S. Cl.
CPC ...... G02F 1/13458 (2013.01); G02F 1/13452 (2013.01); G02F 1/133388 (2021.01); H01L 25/18 (2013.01); H01L 51/525 (2013.01); H01L 27/3276 (2013.01)

(58) Field of Classification Search
CPC ........... G02F 1/13458; G02F 1/133388; G02F 1/13452; H01L 27/3276; H01L 51/5246
See application file for complete search history.

(56) References Cited

U.S. PATENT DOCUMENTS 9,276,230 B2 * 3/2016 Kim .................... H01L 27/3276
10,713,553 B2 7/2020 Shimai et al.
2019/0121180 A1 * 4/2019 Ohashi ................. G06F 3/0412

FOREIGN PATENT DOCUMENTS

| JP | 1998-119335 | 5/1998 |
| JP | 2005-292505 | 10/2005 |
| JP | 2018-049196 | 3/2018 |
| KR | 100669368 | 1/2007 |
| KR | 10-2018-0088891 | 8/2018 |

* cited by examiner

Primary Examiner — Jose R Diaz
(74) Attorney, Agent, or Firm — H.C. Park & Associates, PLC

(57) ABSTRACT

A display device including a lower substrate, a display structure, pad electrodes, and a driver integrated circuit. The lower substrate has a display area and a pad area. The display structure is disposed in the display area on the lower substrate. The pad electrodes are disposed in the pad area on the lower substrate while being spaced apart from each other in a first direction. The driver integrated circuit is spaced apart from the pad electrodes in the second direction in the pad area on the lower substrate, and includes a circuit portion and a first blocking portion spaced apart from the circuit portion in a second direction perpendicular to the first direction.

19 Claims, 10 Drawing Sheets

FIG. 4
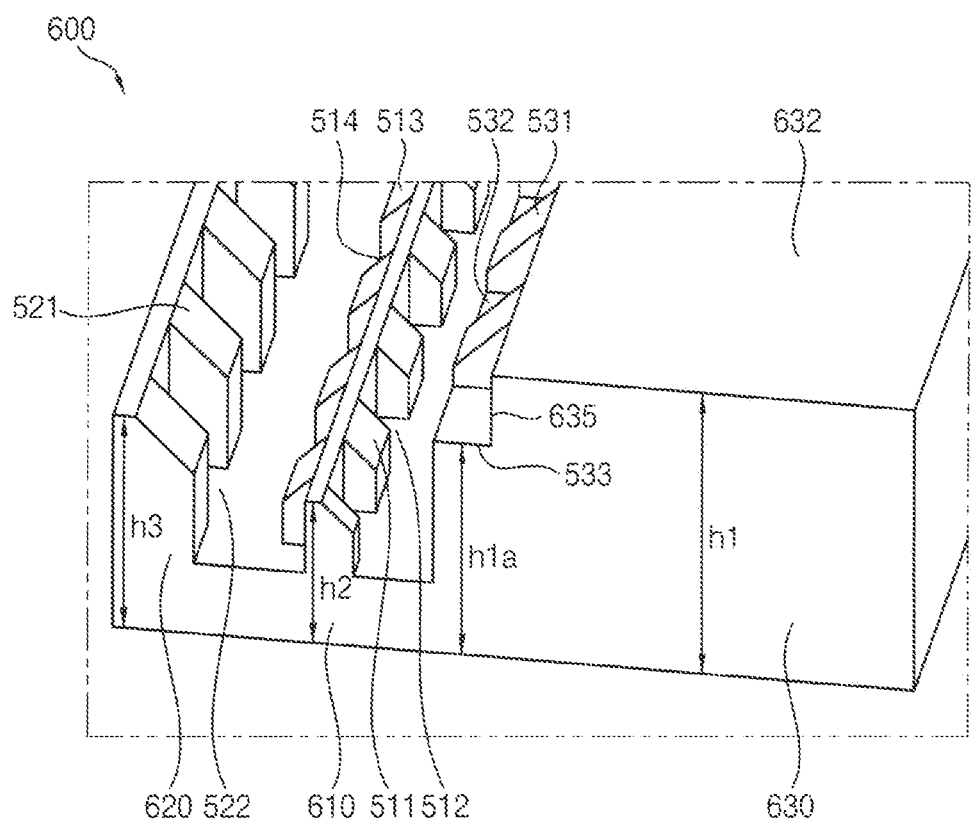
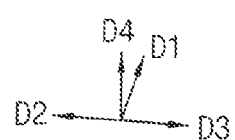

FIG. 6
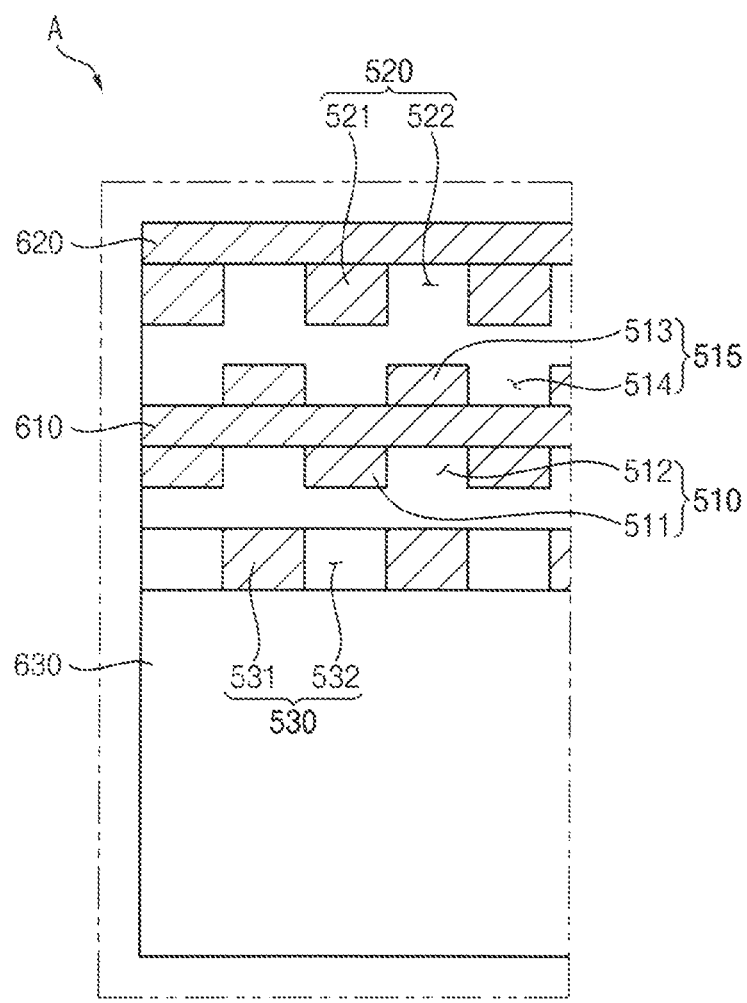
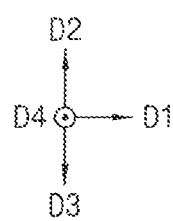

DISPLAY DEVICE

CROSS REFERENCE TO RELATED APPLICATION

This application claims priority from and the benefit of Korean Patent Application No. 10-2019-0168577, filed on Dec. 17, 2019, which is hereby incorporated by reference for all purposes as if fully set forth herein.

BACKGROUND

Field

Exemplary embodiments/implementations of the invention relate generally to a display device and, more specifically, to a display device including a driver integrated circuit.

Discussion of the Background

Flat panel display devices are used as display devices for replacing a cathode ray tube display device due to light-weight and thin characteristics thereof. As representative examples of such flat panel display devices, there are a liquid crystal display device and an organic light emitting diode display device.

The display device may include an upper substrate, a lower substrate, a display structure, an adhesive member, and a cover window, and the lower substrate may be divided into a display area and a pad area. The display structure may be disposed in the display area on the lower substrate, and the upper substrate may be disposed on the display structure. In addition, a plurality of pad electrodes electrically connected to an external device configured to generate signals may be arranged in the pad area on the lower substrate while being spaced apart from each other in one direction. Moreover, a driver integrated circuit may be disposed between the pad electrodes and the upper substrate in the pad area on the lower substrate, and the cover window may be attached onto the upper substrate through the adhesive member. In order to protect the display structure, the upper substrate, the lower substrate, the driver integrated circuit, and the like from an external impact, a resin may be injected between the driver integrated circuit and the cover window. However, when the resin moves from the pad area to the display area so as to make contact with the adhesive member, air bubbles may be generated in the adhesive member, so that defects may be caused in the display device.

The above information disclosed in this Background section is only for understanding of the background of the inventive concepts, and, therefore, it may contain information that does not constitute prior art.

SUMMARY

Exemplary embodiments provide a display device including a driver integrated circuit.

Additional features of the inventive concepts will be set forth in the description which follows, and in part will be apparent from the description, or may be learned by practice of the inventive concepts.

An exemplary embodiment of the invention provides a display device includes a lower substrate, a display structure, pad electrodes, and a driver integrated circuit. The lower substrate has a display area and a pad area. The display structure is disposed in the display area on the lower substrate. The pad electrodes are disposed in the pad area on the lower substrate while being spaced apart from each other in a first direction. The driver integrated circuit is spaced apart from the pad electrodes in the second direction in the pad area on the lower substrate, and includes a circuit portion and a first blocking portion spaced apart from the circuit portion in a second direction perpendicular to the first direction.

In exemplary embodiments, the circuit portion may include a first concavo-convex structure disposed in a step which is formed in a part of a top surface of the circuit portion.

In exemplary embodiments, the first concavo-convex structure may include first protruding patterns protruding from one side surface of the circuit portion in the second direction and first concave patterns each located between two adjacent first protruding patterns among the first protruding patterns.

In exemplary embodiments, a top surface of each of the first protruding patterns may be inclined.

In exemplary embodiments, the first blocking portion may include a second concavo-convex structure spaced apart from the first concavo-convex structure in the second direction.

In exemplary embodiments, the second concavo-convex structure may include second protruding patterns protruding from a first side surface of the first blocking portion in a third direction opposite to the second direction and second concave patterns each located between two adjacent second protruding patterns among the second protruding patterns.

In exemplary embodiments, a top surface of each of the second protruding patterns may be inclined.

In exemplary embodiments, the first blocking portion may further include a third concavo-convex structure configured opposite to the second concavo-convex structure.

In exemplary embodiments, the third concavo-convex structure may include third protruding patterns protruding from a second side surface opposite to the first side surface of the first blocking portion in the second direction and third concave patterns each located between two adjacent third protruding patterns among the third protruding patterns.

In exemplary embodiments, the third protruding patterns may overlap the second concave patterns in the second direction, respectively, and the third concave patterns may overlap the second protruding patterns in the second direction, respectively.

In exemplary embodiments, a top surface of each of the third protruding patterns may be inclined.

In exemplary embodiments, the driver integrated circuit may further include a second blocking portion spaced apart from the first blocking portion in the second direction.

In exemplary embodiments, the second blocking portion may further include a fourth concavo-convex structure facing the first concavo-convex structure.

In exemplary embodiments, the fourth concavo-convex structure may include fourth protruding patterns protruding from one side surface of the second blocking portion in the second direction and fourth concave patterns each located between two adjacent fourth protruding patterns among the fourth protruding patterns.

In exemplary embodiments, a top surface of each of the fourth protruding patterns may be inclined.

In exemplary embodiments, the circuit portion may have a first height from a top surface of the lower substrate to the top surface of the circuit portion. The first blocking portion may have a second height from the top surface of the lower substrate to a top surface of the first blocking portion. The second blocking portion may have a third height from the top surface of the lower substrate to a top surface of the second blocking portion. The first height may be greater than the third height, and the third height may be greater than the second height.

In exemplary embodiments, the circuit portion, the first blocking portion, and the second blocking portion may be integrally formed.

In exemplary embodiments, the display device may further include a cover window disposed on the display structure and the driver integrated circuit, an adhesive member disposed in the display area on a bottom surface of the cover window, and an adhesive layer disposed between the driver integrated circuit and the cover window.

In exemplary embodiments, the adhesive layer may not make contact with the adhesive member.

In exemplary embodiments, the display device may further include an upper substrate disposed between the display structure and the adhesive member.

The display device according to the exemplary embodiments of the present invention includes the driver integrated circuit including the first blocking portion and the second blocking portion, so that the speed of the photocurable resin flowing in the second direction can be slowed down. In this case, the photocurable resin may be irradiated with infrared light and cured before the photocurable resin makes contact with the adhesive member, and the photocurable resin may not make contact with the adhesive member. Accordingly, the adhesive layer does not make contact with the adhesive member, so that defects due to the contact between the adhesive layer and the adhesive member may not be caused in the display device.

In addition, the driver integrated circuit includes the first concavo-convex structure, the second concavo-convex structure, and the third concavo-convex structure, which have inclined surfaces, so that a movement of the photocurable resin can be slowed down.

Moreover, the driver integrated circuit includes the first concavo-convex structure, the second concavo-convex structure, and the third concavo-convex structure, which have inclined surfaces, so that a contact area between the driver integrated circuit and the adhesive layer may be relatively increased. Accordingly, adhesion between the driver integrated circuit and the adhesive layer can be relatively increased.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Exemplary embodiments can be understood in more detail from the following description taken in conjunction with the accompanying drawings, in which:

FIG. 4 is a perspective view illustrating a part of the driver integrated circuit of FIG. 3.

FIG. 6 is a partially enlarged plan view illustrating 'A' region of FIG. 3.

DETAILED DESCRIPTION

Figure 1:
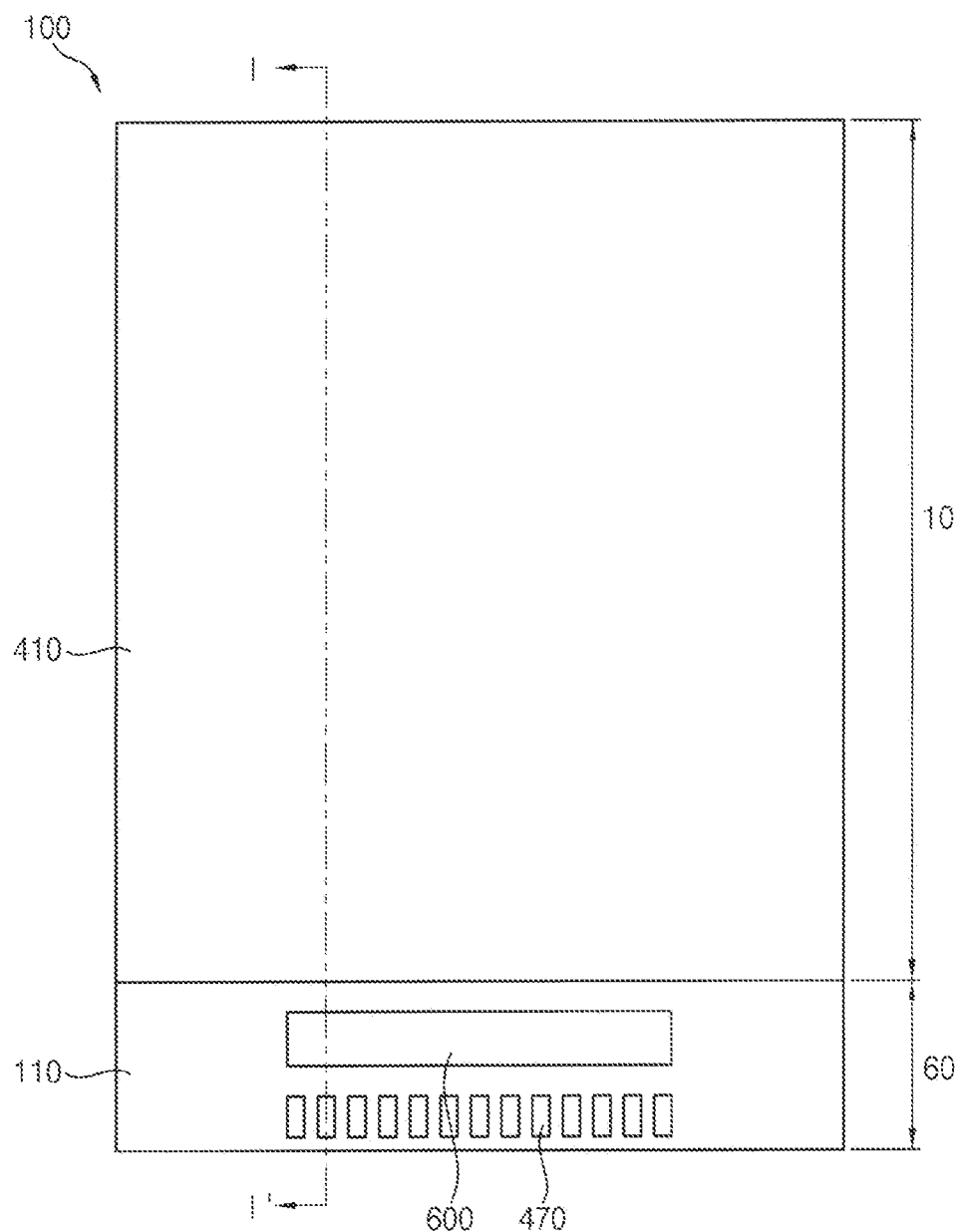
FIG. 1 is a plan view illustrating a display device according to exemplary embodiments of the present invention.

Hereinafter, a display device according to exemplary embodiments of the present invention will be described in detail with reference to the accompanying drawings. In the accompanying drawings, same or similar reference numerals refer to the same or similar elements.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
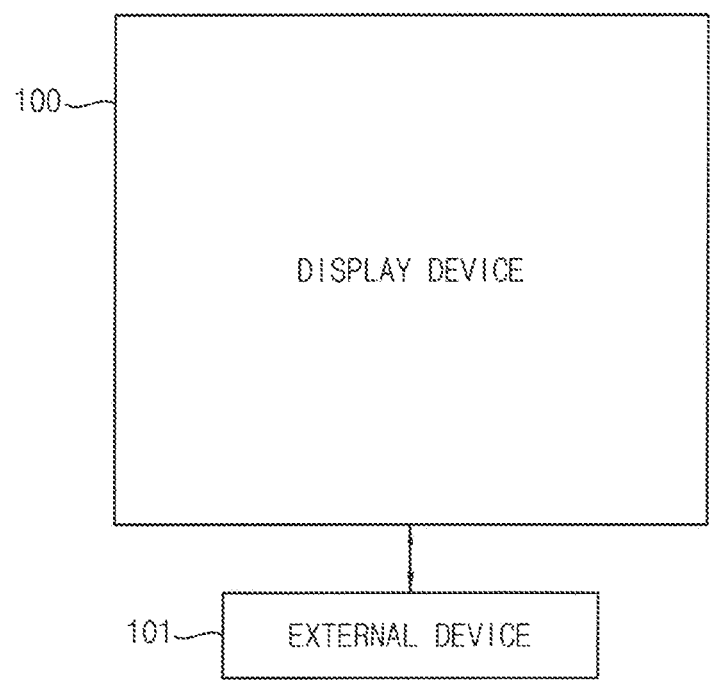
FIG. 2 is a block diagram illustrating an external device electrically connected to the display device.
Figure 3:
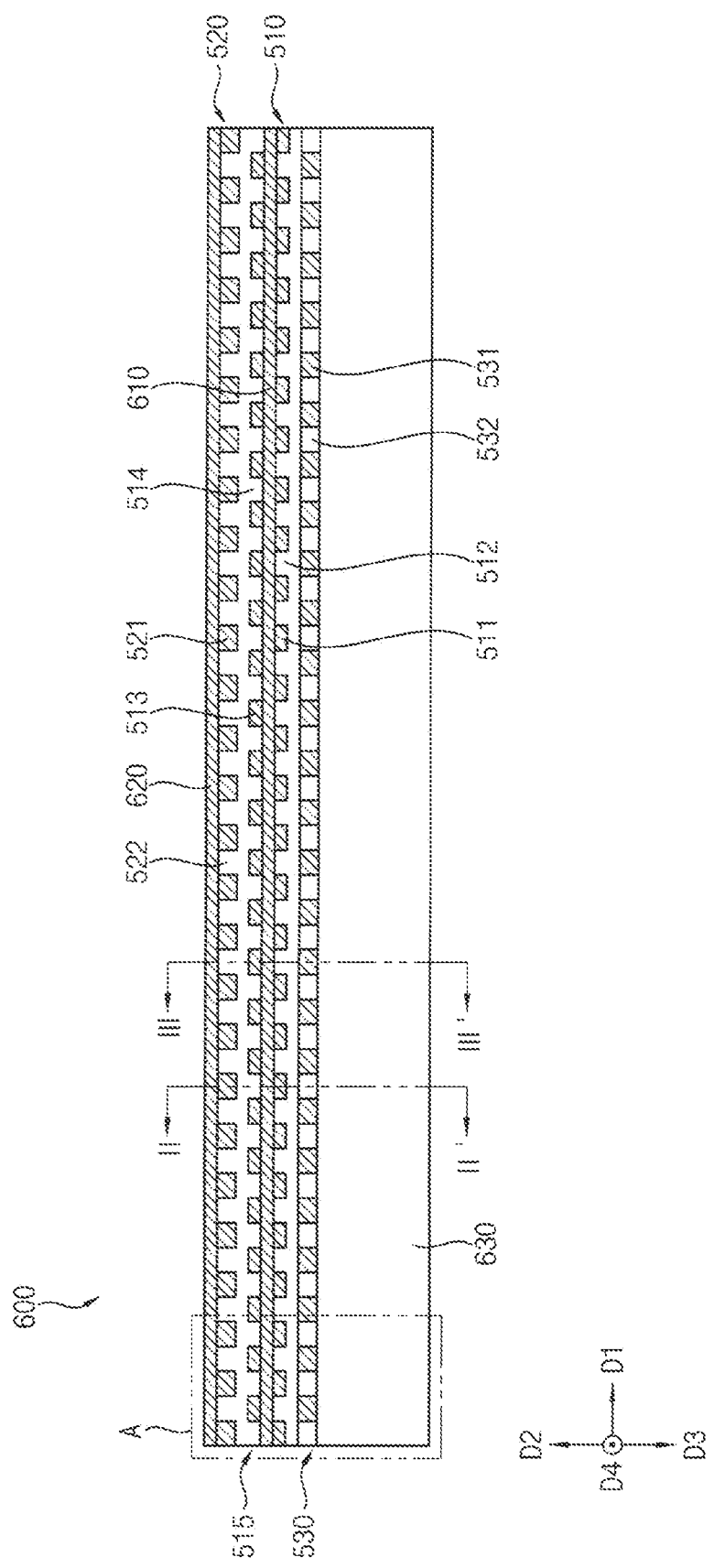
FIG. 3 is a plan view illustrating a driver integrated circuit included in the display device of FIG. 1.
Figure 7:
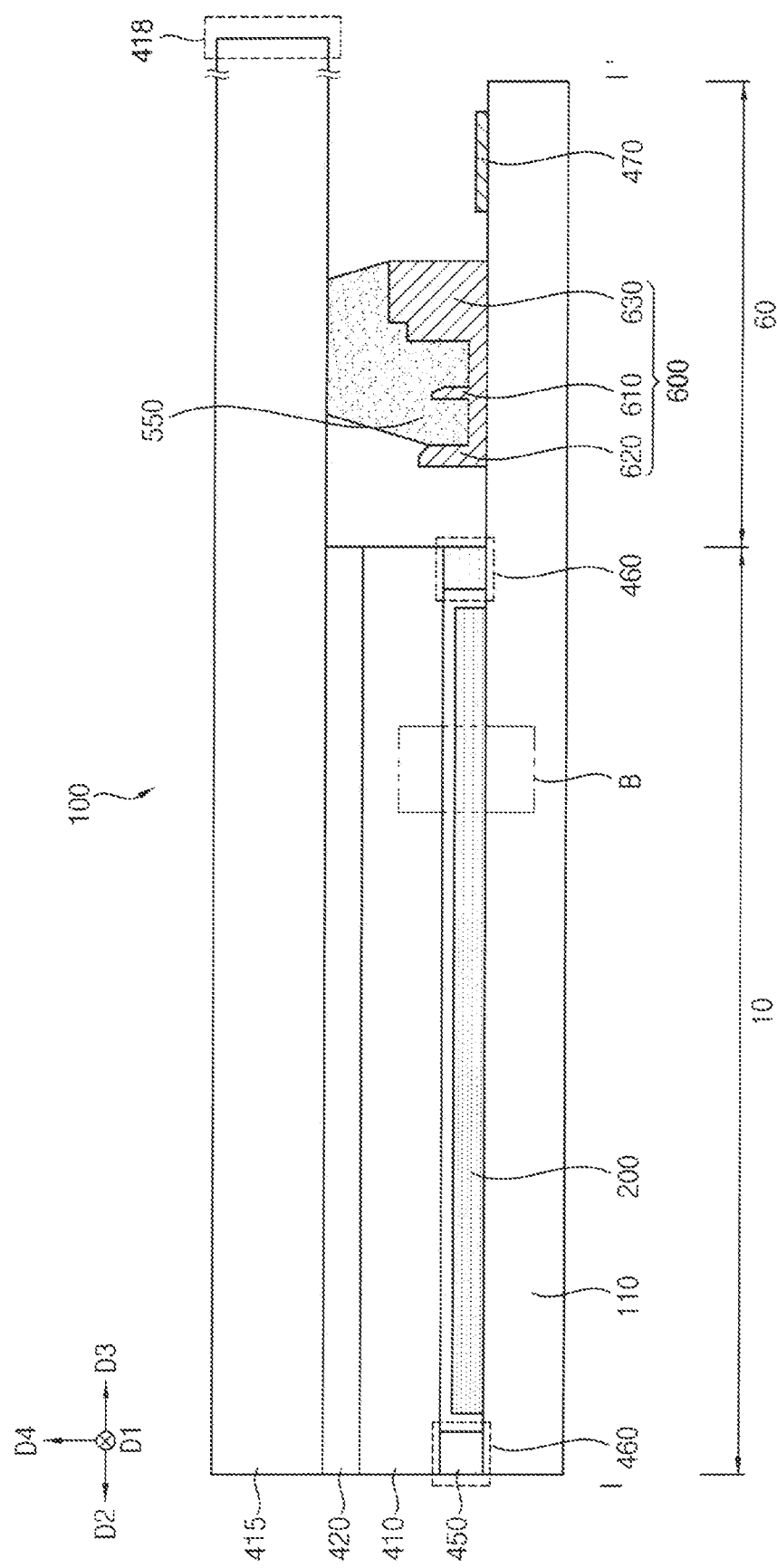
FIG. 7 is a cross-sectional view taken along line I-I' of FIG. 1.

FIG. 1 is a plan view illustrating a display device according to exemplary embodiments of the present invention; FIG. 2 is a block diagram illustrating an external device electrically connected to the display device; FIG. 3 is a plan view illustrating a driver integrated circuit included in the display device of FIG. 1; FIG. 4 is a perspective view illustrating a part of the driver integrated circuit of FIG. 3; FIG. 6 is a partially enlarged plan view illustrating 'A' region of FIG. 3; and FIG. 7 is a cross-sectional view taken along line I-I' of FIG. 1.

Referring to FIGS. 1, 2, 3, 4, 6, and 7, a display device 100 may include a lower substrate 110, a display structure 200, an upper substrate 410, a sealing member 450, an adhesive layer 550, an adhesive member 420, pad electrodes 470, a driver integrated circuit 600, a cover window 415, and the like. In this case, the lower substrate 110 may include a display area 10 and a pad area 60 located on one side of the display area 10, and the driver integrated circuit 600 may include a circuit portion 630, a first blocking portion 610, and a second blocking portion 620. In addition, the circuit portion 630 may include a first concavo-convex structure 530, and the first blocking portion 610 may include a second concavo-convex structure 510 and a third concavo-convex structure 515. Moreover, the second blocking portion 620 may include a fourth concavo-convex structure 520.

The lower substrate 110 may include a transparent or opaque material. The lower substrate 110 may include a quartz substrate, a synthetic quartz substrate, a calcium fluoride substrate, a fluorine-doped quartz substrate (F-doped quartz substrate), a soda lime glass substrate, a non-alkali glass substrate, and the like. In other exemplary embodiments, the lower substrate 110 may be a transparent resin substrate having flexibility. Examples of the transparent resin substrate that may be used as the lower substrate 110 include a polyimide substrate. In this case, the polyimide substrate may include a first polyimide layer, a barrier film layer, a second polyimide layer, and the like.

The display structure 200 may be disposed in the display area 10 and on the lower substrate 110. The display structure 200 may display an image (e.g., a video image) in the display area 10. A sealing member 450 may surround the display structure 200.

The upper substrate 410 may be disposed in the display area 10 on the display structure 200 and on the sealing member 450. The adhesive member 420 may be disposed on the upper substrate 410. In other words, the upper substrate 410 may be disposed between the display structure 200 and the adhesive member 420. The upper substrate 410 may face the lower substrate 110, be disposed in the display area 10, and not be disposed in the pad area 60. The upper substrate 410 may include substantially the same material as the lower substrate 110. For example, the upper substrate 410 may include a quartz substrate, a synthetic quartz substrate, a calcium fluoride substrate, an F-doped quartz substrate, a soda lime glass substrate, a non-alkali glass substrate, and the like. In other exemplary embodiments, the upper substrate 410 may include a transparent inorganic material or flexible plastic. For example, the upper substrate 410 may include a transparent resin substrate having flexibility. In order to improve flexibility of the display device 100, a structure in which at least one inorganic layer and at least one organic layer are alternately stacked may be provided.

An outermost portion of the display area 10 may be defined as a peripheral area 460. The sealing member 450 may be disposed in the peripheral area 460 between the lower substrate 110 and the upper substrate 410. In other words, the sealing member 450 may be disposed along the peripheral area 460, and the sealing member 450 may surround the display structure 200. The sealing member 450 may include a frit material and the like. In addition, the sealing member 450 may include a photocurable material. For example, the sealing member 450 may include a mixture of an organic material and a photocurable material, and the sealing member may be obtained by curing the mixture through irradiating the mixture with ultraviolet (UV) light, laser light, visible light, or the like. The photocurable material included in the sealing member 450 may include an acrylic resin, an epoxy resin, an epoxy acrylate resin, a polyester acrylate resin, a polyester urethane acrylate oligomer resin, a urethane acrylate resin, a urethane acrylate oligomer resin, a polybutadine acrylate resin, a silicone acrylate resin, an alkyl acrylate resin, a vinyl phenol resin, a bismaleimide resin, a diallyl phthalate resin, and the like. For example, the mixture may be irradiated with the laser light. Upon the irradiation with the laser light, a state of the mixture may be changed from a solid state to a liquid state, and the mixture in the liquid state may be cured back to the solid state after a predetermined time. The upper substrate 410 may be coupled to the lower substrate 110 while being sealed by the sealing member 450 with respect to the lower substrate 110 according to the changing state of the mixture.

In addition, wires (e.g., a gate signal wire, a data signal wire, a gate initialization signal wire, an initialization voltage wire, an emission control signal wire, a power supply voltage wire, etc.) may be disposed in the peripheral area 460 of the display structure 200 on the lower substrate 110. In this case, first portions of the wires may be electrically connected to the display structure 200, and second portions of the wires may be electrically connected to the driver integrated circuit 600. In some embodiments, a gate driver may be disposed in the peripheral area 460.

As illustrated in FIG. 7 the cover window 415 may be disposed on the upper substrate 410 and the driver integrated circuit 600. The cover window 415 may extend from the upper substrate 410 in a fourth direction D4 perpendicular to a first direction D1. The cover window 415 may overlap the lower substrate 110 located in the pad area 60, and may extend from the lower substrate 110 located in the pad area 60 in the second direction D2 to overlay the display area 10. In other words, an extended area 418 of the cover window 415 may be larger than an area of the lower substrate 110.

The longer length cover window 415 having extended area 418 may protect the lower substrate 110, the display structure 200, the sealing member 450, the upper substrate 410, the driver integrated circuit 600, the pad electrodes 470, and the like. The cover window 415 with extended portion 418 may include tempered glass, tempered plastic, and the like.

The adhesive member 420 may be disposed in the display area 10 on a bottom surface of the cover window 415. A top surface of the adhesive member 420 may make direct contact with the cover window 415. The adhesive member 420 may allow the cover window 415 to be adhered onto the upper substrate 410.

The adhesive member 420 may include an optical clear adhesive (OCA), a pressure-sensitive adhesive (PSA), an optical clear resin (OCR), and the like. For example, the adhesive may include polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), and the like, and the resin may include a photocurable resin or a thermosetting resin.

The pad electrodes 470 may be disposed in the pad area 60 on the lower substrate 110. The pad electrodes 470 may be spaced apart from each other in the first direction D1 (into the page) which is parallel to a top surface of the lower substrate 110. The pad electrodes 470 may be electrically connected to the driver integrated circuit 600. The pad electrodes 470 may electrically connect the display device 100 to an external device 101 (illustrated in FIG. 2). For example, the external device 101 may generate a gate signal, a data signal, a gate initialization signal, an initialization voltage, an emission control signal, a power supply voltage, and the like. The external device 101 may be electrically connected to the display device 100 through a flexible printed circuit board (FPCB) and the pad electrodes 470, and may provide the gate signal, the data signal, the gate initialization signal, the initialization voltage, the emission control signal, the power voltage, and the like to the display structure 200.

The pad electrodes 470 may include a metal, an alloy, metal nitride, conductive metal oxide, a transparent conductive material, and the like. For example, the pad electrodes 470 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In other exemplary embodiments, each of the pad electrodes 470 may have a multilayer structure including a plurality of metal layers. For example, the metal layers may have mutually different thicknesses or may include mutually different materials.

As illustrated in FIG. 7, the driver integrated circuit 600 may be disposed in the pad area 60 on the lower substrate 110 while being spaced apart from the pad electrodes 470 in the second direction D2. In other words, the pad electrodes may be separated from the driver integrated circuit in the third direction D3.

The driver integrated circuit 600 may be disposed in the pad area 60 on the lower substrate 110 while being spaced apart from the upper substrate 410 (or the sealing member 450) in a third direction D3 opposite to the second direction D2. That is, the driver integrated circuit 600 may be disposed between the upper substrate 410 and the pad electrodes 470.

Among the circuit portion 630, the first blocking portion 610, and the second blocking portion 620, the circuit portion 630 may be positioned closer to the pad electrodes 470. A driver IC chip (not illustrated) may be mounted in the circuit portion 630. One side of the driver IC chip may be electrically connected to the pad electrodes 470. An opposite side of the driver IC chip may be electrically connected to the wires (not illustrated). In exemplary embodiments, the driver IC chip may be receive an input signal (e.g., the data signal) and a driver IC power supply voltage from the external device 101 through the pad electrodes 470, and the driver IC chip may provide an output signal to the display structure 200 through the wires (e.g., a data line) based on the input signal. Accordingly, the driver IC chip may control an operation of the display structure 200. The circuit portion 630 of the driver IC chip 600 may have a first height h1 (illustrated in FIG. 4) from a top surface of the lower substrate 110 to a top surface 632 of the circuit portion 630.

Referring to FIGS. 3, 4, and 6, the circuit portion 630 may have a step portion 533 adjacent the top surface 632 of the circuit portion 630. The step portion 533 may include the concave pattern 532 of the first concavo-convex structure 530. The first concavo-convex structure 530 may be included in the circuit portion 630 and may be disposed on the step 533. The concave portion 532 may double for the step portion 533 or may have an additional structure on the step portion 533. Factoring in the step 533, a height h1$a$ from the top surface of the lower substrate 110 to the bottom surface of the step 533 may be smaller than the first height h1.

The first concavo-convex structure 530 may include first protruding patterns 531 and first concave patterns 532. The first protruding patterns 531 may protrude from one side surface 635 of the circuit portion 630 in the second direction D2 (e.g., a direction from the pad area 60 to the display area 10) perpendicular to the first direction D1. The first protruding patterns 531 may also protrude in the direction D4 from the step portion 533. In the direction D1, the first concave patterns 532 may be located between two adjacent first protruding patterns 531 among the first protruding patterns 531. In other words, a space defined by the two adjacent first protruding patterns 531 may correspond to the first concave pattern 532. In the exemplary embodiments, a top surface of each of the first protruding patterns 531 may be inclined. Each of the first protruding patterns 531 may have the inclined top surface configured to increase a contact area between the first protruding patterns 531 and the adhesive layer 550.

Figure 5A:
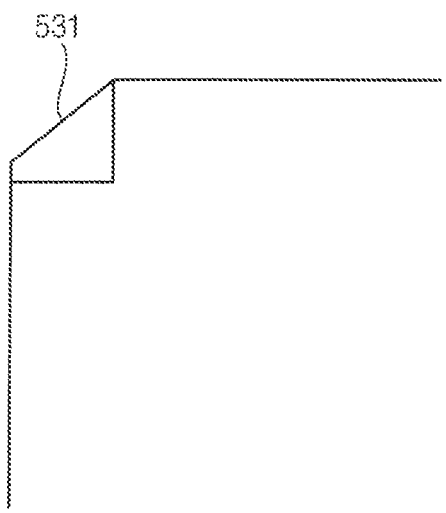
FIGS. 5A, 5B, 5C, and 5D illustrate cross-sectional views of shape variations of the concavo-convex structures in accordance with FIG. 4.
Figure 5B:
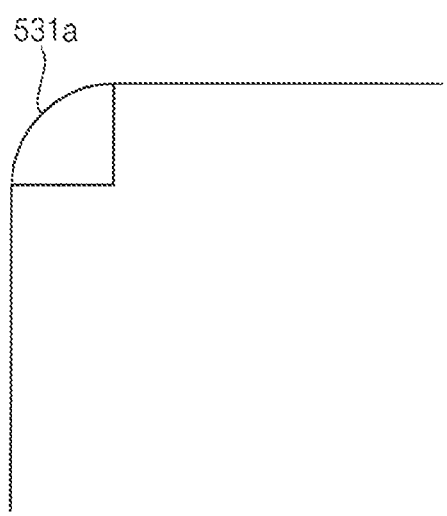

FIGS. 5A-5D illustrates cross-sectional views of shape variations of the concavo-convex structures in accordance with embodiments described herein. As illustrated in FIG. 5A, a top surface of the first protruding patterns 531 may be formed to be inclined. Additionally, as illustrated in FIG. 5B, a top surface 531$a$ of a protruding pattern may be formed to have a rounded convex shape. The rounded convex pattern 531$a$ may also increase a contact area between the first protruding patterns 531 and the adhesive layer 550.

Figure 5C:
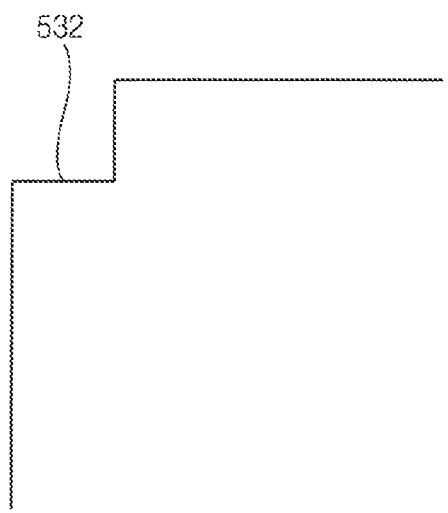
Figure 5D:
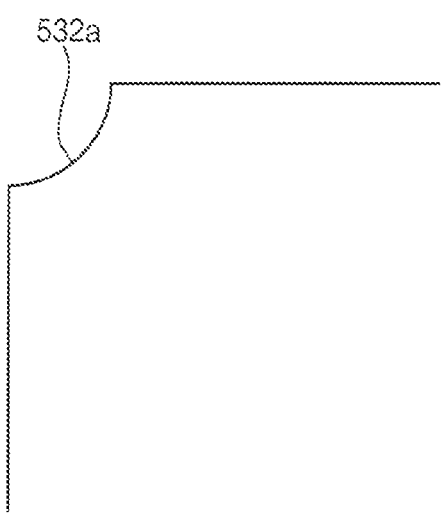

FIG. 5C illustrates the first concave pattern 532. In one embodiment the first concave pattern 532 may take a shape of the step 533. In another embodiment illustrated in FIG. 5D, a surface may include a rounded concave pattern 532$a$. The rounded surface portions of the concavo-convex structures may facilitate easy flow of a photocurable adhesive 550 into the pad area 60 before curing.

The first blocking portion 610 may be spaced apart from the circuit portion 630 in the second direction D2. In other words, the first blocking portion 610 may be located between the second blocking portion 620 and the circuit portion 630, and may protrude in a fourth direction D4 (e.g., a direction from the lower substrate 110 to the upper substrate 410) perpendicular to the first direction D1, the second direction D2, and the third direction D3. For example, the first blocking portion 610 may have a second height h2 from the top surface of the lower substrate 110 to a top surface of the first blocking portion 610, and the second height h2 may be smaller than the first height h1. The first blocking portion 610 may be configured to slow down a speed of a photocurable resin flowing in the second direction D2 from the direction of the circuit portion 630 in a process of forming the adhesive layer 550. Alternatively, the first blocking portion 610 may prevent the adhesive member 420 from making contact with the photocurable resin.

As illustrated in FIGS. 4 and 6, the second concavo-convex structure 510 may be included in the first blocking portion 610. The second concavo-convex structure 510 may be spaced apart from the first concavo-convex structure 530 in the second direction D2 (or the third direction D3), and the third concavo-convex structure 515 may be located on an opposite side of the first blocking portion 610 as the second concavo-convex structure 510. The second concavo-convex structure 510 may include second protruding patterns 511 and second concave patterns 512. The second protruding patterns 511 may protrude from a first side surface of the first blocking portion 610 in the third direction D3. The second concave patterns 512 may be located between two adjacent second protruding patterns 511 among the second protruding patterns 511. In other words, a space defined by the two adjacent second protruding patterns 511 may correspond to the second concave pattern 512. In the exemplary embodiments, a top surface of each of the second protruding patterns 511 may be inclined. For example, each of the second protruding patterns 511 may have an inclined top surface to increase a contact area between the second protruding patterns 511 and the adhesive layer 550.

Additionally, a top surface of each of the first protruding patterns 511 may bow out into a rounded convex shape similar to the rounded convex shape 531$a$ illustrated in FIG. 5B. The rounded convex shape may also increase a contact area between the first protruding patterns 511 and the adhesive layer 550.

The third concavo-convex structure 515 may be included in the first blocking portion 610. The third concavo-convex structure 515 may include third protruding patterns 513 and third concave patterns 514. The third protruding patterns 513 may protrude from a second side surface opposite to the first side surface of the first blocking portion 610 in the second direction D2. The third concave patterns 514 may be located between two adjacent third protruding patterns 513 among the third protruding patterns 513. In other words, a space defined by the two adjacent third protruding patterns 513 may correspond to the third concave pattern 514. In the exemplary embodiments, a top surface of each of the third protruding patterns 513 may be inclined. For example, each of the third protruding patterns 513 may have an inclined top surface to increase a contact area between the third protruding patterns 513 and the adhesive layer 550, but embodiments are not limited thereto. The third protruding portions 513 may be rounded convex structures similar to those illustrated in FIG. 4A.

In addition, the second protruding patterns 511 and the third concave patterns 514 may overlap each other in the second direction D2 (or the third direction D3), respectively, and the second concave patterns 512 and the third protruding patterns 513 may overlap each other in the second direction D2 (or the third direction D3), respectively.

To overlap may mean that a portion of the third concavo-convex structure 515 that is opposing the protruding patterns 511 across the first blocking layer 610 is the third concave portions 514. Similarly a portion of the third concavo-convex structure 515 that is opposing the concave portion 512 across the blocking layer 610 is the convex portion 513, but embodiments are not limited thereto. The protruding regions 513 and 511 could be configured to oppose each other across the light blocking layer 610 or the concave portions 514 and 512 could configured to oppose each other across the light blocking layer 610 to vary obstructions in a level of flow of the photocurable resin.

Alternatively, there may be gaps in the row of protruding portions 511 such that one protruding portion 511 or two protruding portions 511 are missing from a row, etc., or that concave portions 512 are absent such that protruding portions 511 extend a length of two or more of their normal size. This variation in shape frequency may also be possible for other concavo-convex regions 530, 515, and 520.

The second blocking portion 620 may be spaced apart from the first blocking portion 610 in the second direction D2. In other words, among the circuit portion 630, the first blocking portion 610, and the second blocking portion 620, the second blocking portion 620 may be located at a furthermost portion from the pad electrodes 470 and may extend in the fourth direction D4. For example, the second blocking portion 620 may have a third height h3 from the top surface of the lower substrate 110 to a top surface of the second blocking portion 620, and the third height h3 may be larger than the second height h2, smaller than the step height h1a, and smaller than the first height h1. The second blocking portion 620 may slow down the speed of a photocurable resin flowing in the second direction D2 in the process of forming the adhesive layer 550. Alternatively, the second blocking portion 620 may prevent the adhesive member 420 from making contact with the photocurable resin.

The fourth concavo-convex structure 520 may be included in the second blocking portion 620. The fourth concavo-convex structure 520 may include features present and described in other concavo-structures described herein. The fourth concavo-convex structure 520 may be spaced apart from the third concavo-convex structure 515 in the second direction D2, and the fourth concavo-convex structure 520 may face the first concavo-convex structure 530. The fourth concavo-convex structure 520 may include fourth protruding patterns 521 and fourth concave patterns 522. The fourth protruding patterns 521 may protrude from the second blocking portion 620 in the third direction D3. The fourth concave patterns 522 may be located between two adjacent fourth protruding patterns 521 among the fourth protruding patterns 521. In other words, a space defined by the two adjacent fourth protruding patterns 521 may correspond to the fourth concave pattern 522. In the exemplary embodiments, a top surface of each of the fourth protruding patterns 521 may be inclined. For example, each of the fourth protruding patterns 521 may have an inclined top surface to increase a contact area between the fourth protruding patterns 521 and the adhesive layer 550, but embodiments are not limited thereto. The fourth protruding portions 521 may be rounded convex structures similar to those illustrated in FIG. 4A.

In addition, the fourth protruding patterns 521 and the first concave patterns 532 may overlap each other in the second direction D2 (or the third direction D3), respectively, and the fourth concave patterns 522 and the first protruding patterns 531 may overlap each other in the second direction D2 (or the third direction D3), respectively.

Accordingly, the driver integrated circuit 600 including the circuit portion 630, the first blocking portion 610, and the second blocking portion 620 may be provided. In the exemplary embodiments, the circuit portion 630, the first blocking portion 610, and the second blocking portion 620 may be integrally formed, but embodiments are not limited thereto. In alternative embodiments the protruding patterns 531, 511, 513, and 521 may be formed after base layers in order to vary topographies of the step portion 533, first blocking portion 610, and second blocking portion 620.

The adhesive layer 550 may be disposed between the driver integrated circuit 600 and the cover window 415. The adhesive layer 550 may fill in a space between the circuit portion 630 and the first blocking portion 610 and/or a space between the first blocking portion 610 and the second blocking portion 620. The adhesive layer 550 may be provided to protect the display structure 200, the lower substrate 110, the upper substrate 410, the driver integrated circuit 600, and the like from an external impact. In exemplary embodiments, the adhesive layer 550 may not make contact with the adhesive member 420. In other exemplary embodiments, the adhesive layer 550 may pass through the second blocking portion 620 and extend in the second direction D2. Even in this case, however, the adhesive layer 550 may not make contact with the adhesive member 420. The adhesive layer 550 may include a thermosetting resin or a photocurable resin. For example, the adhesive layer 550 may include an epoxy resin, an amino resin, a phenol resin, a urea resin, a melamine resin, an unsaturated polyester resin, a polyurethane resin, a polyimide resin, and the like that is configured to have a low flow rate when put in place.

In one method of manufacturing a display device including a driver integrated circuit, a photocurable resin may be injected between a top surface of the driver integrated circuit and a bottom surface of the cover window 415 in order to form an adhesive layer. The photocurable resin may flow in the second direction D2 on the top surface of the driver integrated circuit due to low viscosity of the photocurable resin, and the photocurable resin may make contact with the adhesive member 420 before infrared light is irradiated onto the photocurable resin to cure the photocurable resin. In this case, a chemical reaction may be caused between the photocurable resin and the adhesive member 420, and air bubbles may be generated in the adhesive member 420 due to the chemical reaction. Accordingly, defects may be caused in the conventional display device including the driver integrated circuit.

The display device 100 according to the exemplary embodiments of the present invention includes the driver integrated circuit 600 including the first blocking portion 610 and the second blocking portion 620, so that the speed of the photocurable resin flowing in the second direction D2 can be slowed down. In this case, the photocurable resin may be irradiated with infrared light and cured before the photocurable resin makes contact with the adhesive member 420, and the photocurable resin may not make contact with the adhesive member 420. Accordingly, the adhesive layer 550 does not make contact with the adhesive member 420, so that defects due to the contact between the adhesive layer 550 and the adhesive member 420 may not be caused in the display device 100.

In addition, the driver integrated circuit 600 includes the first concavo-convex structure 530, the second concavo-convex structure 510, and the third concavo-convex structure 515, which may be configured to have inclined surfaces and concave regions, so that a movement of the photocurable resin can be slowed down as the photocurable resin passes over and within the concavo-convex structures.

Moreover, the driver integrated circuit 600 includes the first concavo-convex structure 530, the second concavo-convex structure 510, and the third concavo-convex structure 515, which have inclined surfaces, so that a contact area between the driver integrated circuit 600 and the adhesive layer 550 may be relatively increased. Accordingly, adhesion between the driver integrated circuit 600 and the adhesive layer 550 can be relatively increased.

Figure 8:
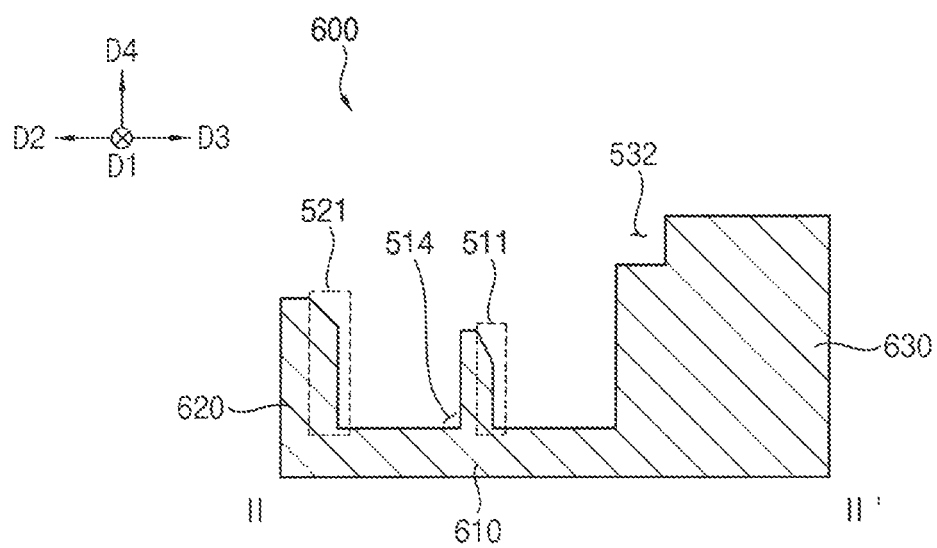
FIG. 8 is a cross-sectional view taken along line II-II' of FIG. 3.
Figure 9:
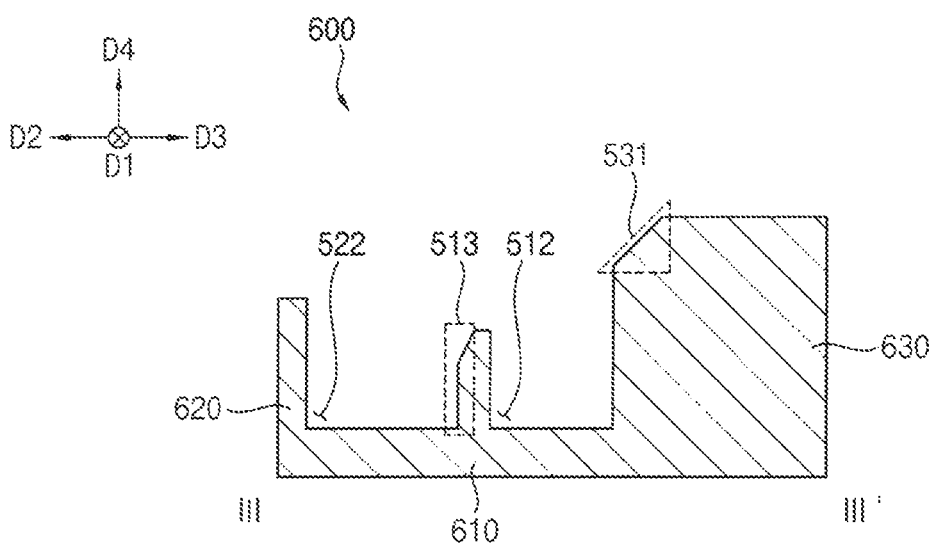
FIG. 9 is a cross-sectional view taken along line of FIG. 3.

FIG. 8 is a cross-sectional view taken along line II-II' of FIG. 3, and FIG. 9 is a cross-sectional view taken along line of FIG. 3.

Referring to FIGS. 3 and 8, a shape of the driver integrated circuit 600 illustrated in FIG. 8 may be the same as a shape of the driver integrated circuit 600 illustrated in FIG. 7. In other words, line I-I' of FIG. 1 may overlap line II-II' of FIG. 3. For example, line II-II' of FIG. 3 may overlap the second blocking portion 620, the fourth protruding pattern 521 of the fourth concavo-convex structure 520, the third concave pattern 514 of the third concavo-convex structure 515, the first blocking portion 610, the second protruding pattern 511 of the second concavo-convex structure 510, the first concave pattern 532 of the first concavo-convex structure 530, and the circuit portion 630.

Referring to FIGS. 3 and 9, a shape of the driver integrated circuit 600 illustrated in FIG. 9 may be different from the shape of the driver integrated circuit 600 illustrated in FIG. 8. For example, line of FIG. 3 may overlap the second blocking portion 620, the fourth concave pattern 522 of the fourth concavo-convex structure 520, the third protruding pattern 513 of the third concavo-convex structure 515, the first blocking portion 610, the second concave pattern 512 of the second concavo-convex structure 510, the first protruding pattern 531 of the first concavo-convex structure 530, and the circuit portion 630.

Figure 10:
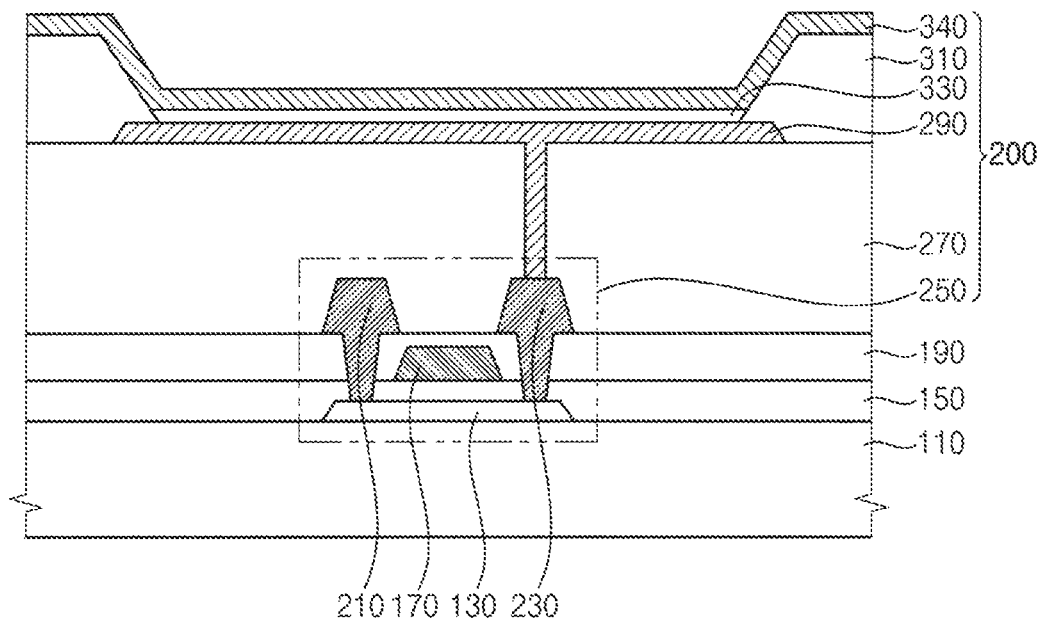
FIG. 10 is a partially enlarged sectional view illustrating '13' region of FIG. 7.

FIG. 10 is a partially enlarged sectional view illustrating 'B' region of FIG. 7.

Referring to FIG. 10, the display structure 200 may include a semiconductor element 250, a planarization layer 270, a pixel defining layer 310, a lower electrode 290, a light emitting layer 330, and an upper electrode 340. In this case, the semiconductor element 250 may include an active layer 130, a gate insulating layer 150, a gate electrode 170, an insulating interlayer 190, a source electrode 210, and a drain electrode 230. The display structure 200 may be disposed in the display area 10 between the lower substrate 110 and the upper substrate 410.

A buffer layer (not illustrated) may be disposed on the lower substrate 110. The buffer layer may be disposed over the lower substrate 110. The buffer layer may prevent metal atoms or impurities from diffusing from the lower substrate 110, and may control a heat transfer rate during a crystallization process configured to form the active layer 130 to obtain a substantially uniform active layer 130. In addition, when a surface of the lower substrate 110 is not uniform, the buffer layer may serve to improve flatness of the surface of the lower substrate 110. Depending on a type of the lower substrate 110, at least two buffer layers may be provided on the lower substrate 110, or the buffer layer may not be provided. The buffer layer may include a silicon compound, metal oxide, and the like.

The active layer 130 may be disposed on the lower substrate 110, and the active layer 130 may include a metal oxide semiconductor, an inorganic semiconductor (e.g., amorphous silicon or poly silicon semiconductor), an organic semiconductor, or the like. The active layer 130 may have a source region and a drain region.

The gate insulating layer 150 may be disposed on the active layer 130. The gate insulating layer 150 may be disposed on the lower substrate 110 to cover the active layer 130. For example, the gate insulating layer 150 may sufficiently cover the active layer 130, and may have a substantially flat top surface without creating a step around the active layer 130. In some embodiments, the gate insulating layer 150 may be disposed along a profile of the active layer 130 with a uniform thickness to cover the active layer 130 on the lower substrate 110. The gate insulating layer 150 may include a silicon compound, metal oxide, and the like. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In other exemplary embodiments, the gate insulating layer 150 may have a multilayer structure including a plurality of insulating layers. For example, the insulating layers may have mutually different thicknesses or may include mutually different materials.

The gate electrode 170 may be disposed at a portion of the gate insulating layer 150 under which the active layer 130 is located. The gate electrode 170 may include a metal, an alloy, metal nitride, conductive metal oxide, a transparent conductive material, and the like. These may be used alone or in combination with each other. In other exemplary embodiments, the gate electrode 170 may have a multilayer structure including a plurality of metal layers. For example, the metal layers may have mutually different thicknesses or may include mutually different materials.

The insulating interlayer 190 may be disposed on the gate electrode 170. The insulating interlayer 190 may be disposed on the gate insulating layer 150 to cover the gate electrode 170. For example, the insulating interlayer 190 may sufficiently cover the gate electrode 170 on the gate insulating layer 150, and may have a substantially flat top surface without creating a step around the gate electrode 170. In some embodiments, the insulating interlayer 190 may be disposed along a profile of the gate electrode 170 with a uniform thickness to cover the gate electrode 170 on the gate insulating layer 150. The insulating interlayer 190 may include a silicon compound, metal oxide, and the like. In other exemplary embodiments, the insulating interlayer 190 may have a multilayer structure including a plurality of insulating layers. For example, the insulating layers may have mutually different thicknesses or may include mutually different materials.

The source electrode 210 and the drain electrode 230 may be disposed on the insulating interlayer 190. The source electrode 210 and the drain electrode 230 may be connected to the source region and the drain region of the active layer 130 through contact holes formed by removing parts of the gate insulating layer 150 and the insulating interlayer 190, respectively. Each of the source electrode 210 and the drain electrode 230 may include a metal, an alloy, metal nitride, conductive metal oxide, a transparent conductive material, and the like. These may be used alone or in combination with each other. In other exemplary embodiments, each of the source electrode 210 and the drain electrode 230 may have a multilayer structure including a plurality of metal layers. For example, the metal layers may have mutually different thicknesses or may include mutually different materials.

Accordingly, the semiconductor element 250 including the active layer 130, the gate insulating layer 150, the gate electrode 170, the insulating interlayer 190, the source electrode 210, and the drain electrode 230 may be provided.

Although the semiconductor element 250 has been described as having a top gate structure, the configuration of the present invention is not limited thereto. For example, the semiconductor element 250 may have a bottom gate structure, a double gate structure, or the like.

The planarization layer 270 may be disposed on the source electrode 210 and the drain electrode 230. The planarization layer 270 may cover the source electrode 210 and the drain electrode 230. In other words, the planarization layer 270 may be disposed over the insulating interlayer 190. In the exemplary embodiments, the planarization layer 270 may have a relatively thick thickness to sufficiently cover the source electrode 210 and the drain electrode 230. In this case, the planarization layer 270 may have a substantially flat top surface. In order to implement such a flat top surface of the planarization layer 270, a planarization process may be additionally performed on the planarization layer 270. In some embodiments, the planarization layer 270 may be disposed along a profile of the source electrode 210 and the drain electrode 230 with a uniform thickness to cover the source electrode 210 and the drain electrode 230. The planarization layer 270 may be formed of an organic material or an inorganic material. In the exemplary embodiments, the planarization layer 270 may include an organic material such as a photoresist, a polyacryl-based resin, a polyimide-based resin, a polyamide-based resin, a siloxane-based resin, an acryl-based resin, and an epoxy-based resin.

The lower electrode 290 may be disposed on the planarization layer 270. The lower electrode 290 may be connected to the drain electrode 230 through a contact hole formed by removing a part of the planarization layer 270. In addition, the lower electrode 290 may be electrically connected to the semiconductor element 250. The lower electrode 290 may include a metal, an alloy, metal nitride, conductive metal oxide, a transparent conductive material, and the like. These may be used alone or in combination with each other. In other exemplary embodiments, the lower electrode 290 may have a multilayer structure including a plurality of metal layers. For example, the metal layers may have mutually different thicknesses or may include mutually different materials.

The pixel defining layer 310 may be disposed on the planarization layer 270, and may expose a part of a top surface of the lower electrode 290. The pixel defining layer 310 may be formed of an organic material or an inorganic material. In the exemplary embodiments, the pixel defining layer 310 may include an organic material.

The light emitting layer 330 may be disposed on the lower electrode 290 which is at least partially exposed. The light emitting layer 330 may be formed by using at least one of light emitting materials configured to emit different color lights (i.e., red light, green light, blue light, etc.) according to pixels. Alternatively, the light emitting layer 330 may be formed by stacking a plurality of light emitting materials configured to generate different color lights such as red light, green light, and blue light to emit white light as a whole. In this case, a color filter may be disposed on the light emitting layer 330. The color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed on the pixel defining layer 310 and the light emitting layer 330. The upper electrode 340 may include a metal, an alloy, metal nitride, conductive metal oxide, a transparent conductive material, and the like. In other exemplary embodiments, the upper electrode 340 may have a multilayer structure including a plurality of metal layers. For example, the metal layers may have mutually different thicknesses or may include mutually different materials.

Accordingly, the display structure 200 including the semiconductor element 250, the planarization layer 270, the pixel defining layer 310, the lower electrode 290, the light emitting layer 330, and the upper electrode 340 may be provided.

Although the display device 100 according to the present invention has been described as being an organic light emitting diode display device, the configuration of the present invention is not limited thereto. In other exemplary embodiments, the display device 100 may include a liquid crystal display device (LCD), a field emission display device (FED), a plasma display device (PDP), or an electrophoretic image display device (EPD).

The present invention may be applied to various electronic devices including a display device. For example, the present invention may be applied to vehicle-display device, a ship-display device, an aircraft-display device, portable communication devices, display devices for display or for information transfer, a medical-display device, etc The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A display device comprising:
   a lower substrate having a display area and a pad area;
   a display structure disposed in the display area on the lower substrate;
   pad electrodes disposed in the pad area on the lower substrate while being spaced apart from each other in a first direction;
   a cover window disposed on the display structure and the driver integrated circuit;
   an adhesive member disposed in the display area on a bottom surface of the cover window; and
   an adhesive layer disposed between the driver integrated circuit and the cover window; and a driver integrated circuit spaced apart from the pad electrodes in a second direction perpendicular to the first direction in the pad area on the lower substrate, the driver integrated circuit comprising:
a circuit portion; and
a first blocking portion spaced apart from the circuit portion in the second direction.

2. The display device of claim 1, wherein the circuit portion comprises:
a top surface;
a step portion adjacent the top surface; and
a first concavo-convex structure disposed on the step portion.

3. The display device of claim 2, wherein the first concavo-convex structure comprises:
first protruding patterns protruding from one side surface of the circuit portion in the second direction; and
first concave patterns each located between two adjacent first protruding patterns among the first protruding patterns.

4. The display device of claim 3, wherein a top surface of each of the first protruding patterns is inclined.

5. The display device of claim 2, wherein the first blocking portion includes a second concavo-convex structure spaced apart from the first concavo-convex structure in the second direction.

6. The display device of claim 5, wherein the second concavo-convex structure comprises:
second protruding patterns protruding from a first side surface of the first blocking portion in a third direction opposite to the second direction; and
second concave patterns each located between two adjacent second protruding patterns among the second protruding patterns.

7. The display device of claim 6, wherein a top surface of each of the second protruding patterns is inclined.

8. The display device of claim 6, wherein the first blocking portion further includes a third concavo-convex structure configured opposite to the second concavo-convex structure.

9. The display device of claim 8, wherein the third concavo-convex structure comprises:
third protruding patterns protruding from a second side surface opposite to the first side surface of the first blocking portion in the second direction; and
third concave patterns each located between two adjacent third protruding patterns among the third protruding patterns.

10. The display device of claim 9, wherein:
the third protruding patterns overlap the second concave patterns in the second direction, respectively; and
the third concave patterns overlap the second protruding patterns in the second direction, respectively.

11. The display device of claim 9, wherein a top surface of each of the third protruding patterns is inclined.

12. The display device of claim 8, wherein the driver integrated circuit further includes a second blocking portion spaced apart from the first blocking portion in the second direction.

13. The display device of claim 12, wherein the second blocking portion further includes a fourth concavo-convex structure facing the first concavo-convex structure.

14. The display device of claim 13, wherein the fourth concavo-convex structure comprises:
fourth protruding patterns protruding from one side surface of the second blocking portion in the second direction; and
fourth concave patterns each located between two adjacent fourth protruding patterns among the fourth protruding patterns.

15. The display device of claim 14, wherein a top surface of each of the fourth protruding patterns is inclined.

16. The display device of claim 12, wherein:
the circuit portion has a first height from a top surface of the lower substrate to the top surface of the circuit portion;
the first blocking portion has a second height from the top surface of the lower substrate to a top surface of the first blocking portion;
the second blocking portion has a third height from the top surface of the lower substrate to a top surface of the second blocking portion;
the first height is greater than the third height; and
the third height is greater than the second height.

17. The display device of claim 12, wherein the circuit portion, the first blocking portion, and the second blocking portion are integrally formed.

18. The display device of claim 1, wherein the adhesive layer does not make contact with the adhesive member.

19. The display device of claim 1, further comprising an upper substrate disposed between the display structure and the adhesive member.

* * * * *